(12) United States Patent
Lee

(10) Patent No.: US 8,963,614 B2
(45) Date of Patent: Feb. 24, 2015

(54) SEMICONDUCTOR DEVICE

(71) Applicant: SK Hynix Inc., Gyeonggi-do (KR)

(72) Inventor: Sang-Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,819

(22) Filed: Dec. 15, 2013

(65) Prior Publication Data

US 2015/0002210 A1 Jan. 1, 2015

(30) Foreign Application Priority Data

Jun. 28, 2013 (KR) ........................ 10-2013-0075237

(51) Int. Cl.
*H03K 17/00* (2006.01)
*H03K 17/72* (2006.01)
(52) U.S. Cl.
USPC ............................ 327/408; 327/410; 327/436
(58) Field of Classification Search
USPC .......................................... 327/408, 410, 436
See application file for complete search history.

(56) References Cited

U.S. PATENT DOCUMENTS 5,874,836 A * 2/1999 Nowak et al. .................... 326/83
6,121,806 A * 9/2000 Kono et al. ..................... 327/205
6,903,595 B2 * 6/2005 Won ............................... 327/403

FOREIGN PATENT DOCUMENTS

KR 1020080044163 5/2008
KR 1020090088291 8/2009

* cited by examiner

*Primary Examiner* — Kenneth B. Wells
(74) *Attorney, Agent, or Firm* — IP & T Group LLP

(57) ABSTRACT

A semiconductor device includes an internal high voltage terminal supplied with an internal high voltage, an internal negative voltage terminal supplied with an internal negative voltage, a monitoring pad suitable for monitoring the internal high and negative voltages, a first switch suitable for controlling electrical connection between the high voltage terminal and the monitoring pad and including two or more transistors coupled in series, and a second switch suitable for controlling electrical connection between the negative voltage terminal and the monitoring pad and including two or more transistors coupled in series.

14 Claims, 2 Drawing Sheets

US 8,963,614 B2

SEMICONDUCTOR DEVICE

CROSS-REFERENCE TO RELATED APPLICATIONS

The present application claims priority of Korean Patent Application No. 10-2013-0075237, filed on Jun. 28, 2013, which is incorporated herein by reference in its entirety.

BACKGROUND

1. Field

Exemplary embodiments of the present invention relate to a semiconductor device, and more particularly, to a semiconductor device having a pad for monitoring a voltage used in the semiconductor device.

2. Description of the Related Art

A variety of semiconductor devices operate internal circuits using a voltage supplied from outside. However, since various types of voltages are used in a semiconductor device, all of the voltages to be used in the semiconductor device cannot be supplied from outside. Thus, the semiconductor device includes voltage generation circuits for internally generating various levels of voltages. As an example of the semiconductor devices, a memory device is supplied with a power supply voltage and a ground voltage from the outside and generates a high voltage having a higher level than the power supply voltage and a negative voltage having a lower level than the ground voltage to be used therein.

Due to various internal factors of the semiconductor device, the levels of internal voltages generated by the semiconductor device may be more unstable than the levels of externally supplied voltages. Thus, research has been being conducted on techniques for monitoring internal voltages of a semiconductor device.

SUMMARY

Various embodiments of the present invention are directed to a technique for monitoring the levels of voltages, which are internally generated in a semiconductor device.

In an embodiment of the present invention, a semiconductor device includes an internal high voltage terminal supplied with an internal high voltage, an internal negative voltage terminal supplied with an internal negative voltage, a monitoring pad suitable for monitoring the internal high and negative voltages, a first switch suitable for controlling electrical connection between the high voltage terminal and the monitoring pad and including two or more transistors coupled in series; and a second switch suitable for controlling electrical connection between the negative voltage terminal and the monitoring pad and including two or more transistors coupled in series.

In another embodiment of the present invention, a semiconductor device includes an internal high voltage terminal supplied with a high voltage higher than a power supply voltage, an internal negative voltage terminal supplied with a negative voltage lower than a ground voltage, a monitoring pad suitable for monitoring the high voltage and the negative voltage, a first PMOS transistor suitable for controlling electrical connection between the internal high voltage terminal and a first node, turned on by the ground voltage, and turned off by the high voltage, a second PMOS transistor suitable for controlling electrical connection between the first node and the monitoring pad, turned on by the ground voltage, and turned off by the power supply voltage, a first NMOS transistor suitable for controlling electrical connection between the internal negative voltage terminal and a second node, turned on by the power supply voltage, and turned off by the negative voltage, and a second NMOS transistor suitable for controlling electrical connection between the second node and the monitoring pad, turned on by the power supply voltage, and turned off by the ground voltage.

In yet another embodiment of the present invention, a semiconductor device includes a first voltage terminal supplied with a first internal voltage, a second voltage terminal supplied with a second internal voltage, a monitoring pad suitable for monitoring the first and second internal voltages, first and second switches coupled in series between the first voltage terminal and the monitoring pad and turned on/off in response to first and second select signals, respectively, and third and fourth switches coupled in series between the second voltage terminal and the monitoring pad and turned on/off in response to third and fourth select signals, respectively.

DETAILED DESCRIPTION

Figure 1:
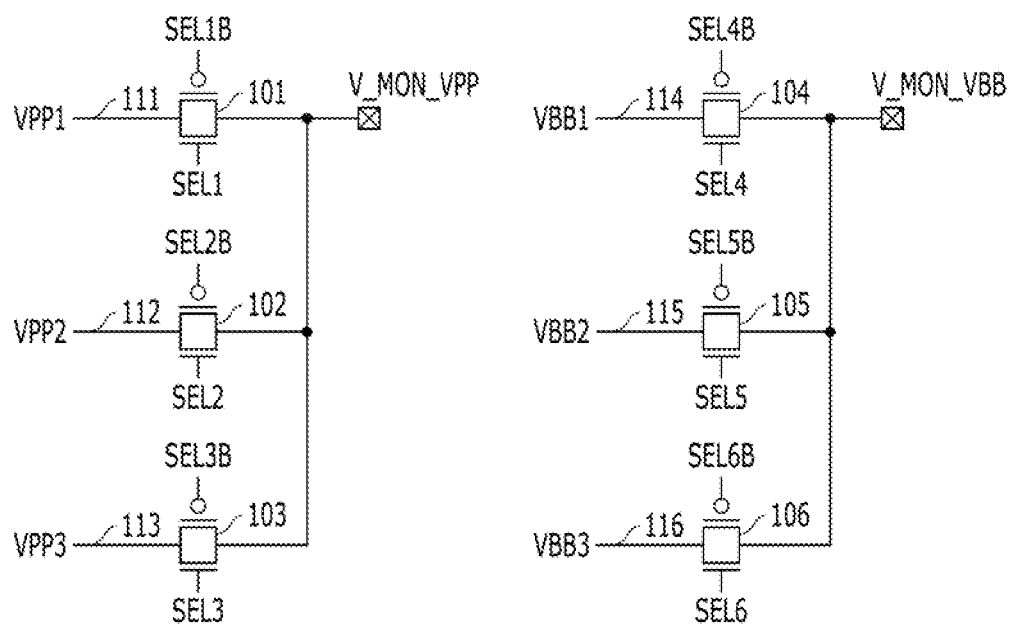
FIG. 1 illustrates a configuration diagram of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a configuration diagram of a semiconductor device in accordance with an embodiment of the present invention.

Referring to FIG. 1, the semiconductor device includes internal voltage terminals 111 to 116, a high voltage monitoring pad V_MON_VPP, a negative voltage monitoring pad V_MON_VBB, and switches 101 to 106.

The internal terminals 111 to 116 are supplied with internal voltages VPP1, VPP2, VPP3, VBB1, VBB2 and VBB3 which are internally generated in the semiconductor device. The voltage terminals 111 to 113 are supplied with high voltages VPP1, VPP2 and VPP3 having a higher level than a power supply voltage VDD, and the voltage terminals 114 to 116 are supplied with negative voltages VBB1, VBB2 and VBB3 having a lower level than a ground voltage VSS (i.e., 0V). The voltages VPP1, VPP2, VPP3, VBB1, VBB2 and VBB3 may be generated by a pump circuit (not illustrated) inside the semiconductor device. Hereafter, it is described as an example that the levels of the high voltages VPP1, VPP2 and VPP3 have a relation of VPP1>VPP2>VPP3>VDD and the levels of the negative voltages VBB1, VBB2 and VBB3 have a relation of VBB1<VBB2<VBB3<VSS.

The switches 101 to 103 re turned on/off in response to activation of select signals SEL1, SEL2 and SEL3. Since the select signals SEL1, SEL2 and SEL3 are activated one at a time, one of the internal voltage terminals 111 to 113 is electrically coupled to the high voltage monitoring pad V_MON_VPP. As a result, the voltage level of the internal voltage terminal selected from the internal voltage terminals 111 to 113 may be monitored through the high voltage monitoring pad V_MON_VPP.

The switches 104 to 106 are turned on/off in response to activation of select signals SEL4, SEL5 and SEL6. Since the select signals SEL4, SEL5 and SEL6 are activated one at a time, one voltage terminal of the internal voltage terminals 114 to 116 is electrically coupled to the negative voltage monitoring pad V_MON_VBB. As a result, the voltage level of the internal voltage terminal selected from the internal voltage terminals 114 to 116 may be monitored through the negative voltage monitoring pad V_MON_VBB from the outside the semiconductor device.

Table 1 shows the activation voltage levels and deactivation voltage levels of select signals SEL1-SEL3, SELB1-SELB3, SEL4-SEL6 and SELB4-SELB6.

TABLE 1

|  | SEL1-SEL3 | SELB1-SELB3 | SEL4-SEL6 | SELB4-SELB6 |
|---|---|---|---|---|
| Activation voltage | VPP1 | 0 | VDD | VBB1 |
| Deactivation voltage | 0 | VPP1 | VBB1 | VDD |

Referring to Table 1, since the switches 101 to 103 control the electrical connection between the high voltage terminals 111 to 113 and the high voltage monitoring pad V_MON_VPP, the levels of the select signals SEL1-SEL3 and SELB1-SELB3 swing from 0 to VPP1. Furthermore, since the switches 104 to 106 control the electrical connection between the negative voltage terminals 114 to 116 and the negative voltage monitoring pad V_MON_VBB, the levels of the select signals SEL4-SEL6 and SELB4-SELB6 swing from VBB1 to VDD.

The reason why the high voltages VPP1, VPP2 and VPP3 and the negative voltages VBB1, VBB2 and VBB3 are monitored through the monitoring pads V_MON_VPP and V_MON_VBB separated from each other is that there is a limit in potential difference at which the transistors forming the switches 101 to 106 may operate without breaking down. For example, when the high voltage VPP1 and the negative voltage VBB1 are monitored through one monitoring pad, the high voltage VPP1 and the negative voltage VBB1 may be applied across the transistor forming the switch 101 at the same time, thereby breaking the transistor.

Figure 2:
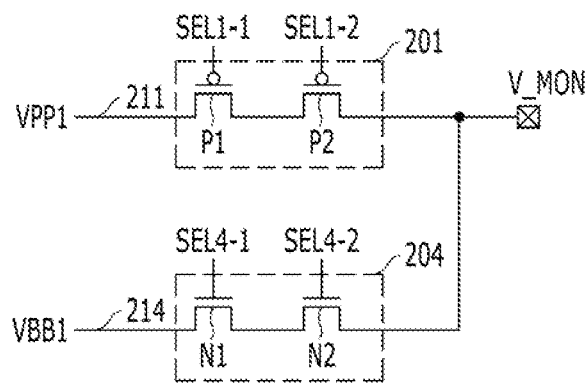
FIG. 2 illustrates a configuration diagram of a semiconductor device in accordance with another embodiment of the present invention.

FIG. 2 is a configuration diagram of semiconductor device in accordance with another embodiment of the present invention. Referring to FIG. 2, a technique for monitoring both of a high voltage VPP1 and a negative voltage VBB1 through one monitoring pad V_MON will be described.

Referring to FIG. 2, the semiconductor device includes an internal high voltage terminal 211, an internal negative voltage terminal 214, a monitoring pad V_MON, and switches 201 and 204.

The internal high voltage terminal 211 is supplied with a high voltage VPP1 having a higher level than a power supply voltage, and the internal negative voltage terminal 214 is supplied with a negative voltage VBB1 having a lower level than a ground voltage. The voltages VPP1 and VBB1 may be generated by a pump circuit (not illustrated) inside the semiconductor device.

The switch 201 is configured to control connection between the internal high voltage terminal 211 and the monitoring pad V_MON. When the switch 204 is turned on to apply the negative voltage VBB1 to the monitoring pad V_MON, the high voltage VPP1 and the negative voltage VBB1 are applied across the switch 201. However, since the switch 201 includes two or more transistors P1 and P2 coupled in series, the switch 201 may be prevented from breaking down. The transistors P1 and P2 may include PMOS transistors as illustrated in FIG. 2. Although a select signal SEL1-1 for controlling the transistor P1 and a select signal SEL1-2 for controlling the transistor P2 are activated/deactivated at the same time, the voltage levels of the select signals SEL1-1 and SEL1-2 may differ from each other. Table 2 shows the activation/deactivation voltage levels of the select signals SEL1-1 and SEL1-2.

The switch 204 may control connection between the internal negative voltage terminal 214 and the monitoring pad V_MON. When the switch 201 is turned on to apply the high voltage VPP1 to the monitoring pad V_MON, the negative voltage VBB1 and the high voltage VPP1 are applied across the switch 204. However, since the switch 204 includes two or more transistors N1 and N2 coupled in series, the switch 204 may be prevented from breaking down. The transistors N1 and N2 may include NMOS transistors as illustrated in FIG. 2. Although a select signal SEL4-1 for controlling the transistor N1 and a select signal SEL4-2 for controlling the transistor N2 are activated/deactivated at the same time, the voltage levels of the select signals SEL4-1 and SEL4-2 may differ from each other. Table 2 shows the activation/deactivation voltage levels of the select signals SEL4-1 and SEL4-2. For reference, while the select signals SEL4-1 and SEL4-2 are activated, the select signals SEL1-1 and SEL1-2 are deactivated, and while the select signals SEL1-1 and SEL1-2 are activated, the select signals SEL4-1 and SEL4-2 are deactivated.

TABLE

|  | SEL1-1 | SEL1-2 | SEL4-1 | SEL4-2 |
|---|---|---|---|---|
| Activation voltage | 0 | 0 | VDD | VDD |
| Deactivation voltage | VPP1 | VDD | VBB1 | 0 |

When the select signals SEL1-1, SEL1-2, SEL4-1 and SEL4-2 are controlled as shown in Table 2, the high voltage VPP1 and the negative voltage VBB1 are not simultaneously applied to the both terminals of the transistors P1, P2, P3 and P4 in either a case where the switch 201 is turned on or a case where the switch 204 is turned on. Thus, although the high voltage VPP1 and the negative voltage VBB1 are monitored through one monitoring pad V_MON, the switches 201 and 204 may be prevented from breaking down.

In the embodiment of FIG. 2, the switch 201 includes only PMOS transistors P1 and P2, and the switch 204 includes only NMOS transistors N1 and N2. This is because, although only the PMOS transistors P1 and P2 are used, the high voltage VPP1 may be transmitted to the monitoring pad V_MON without a loss, and although only the NMOS transistors N1 and N2 are used, the negative voltage VBB1 may be transmitted to the monitoring pad V_MON without a loss. Furthermore, when the deactivation voltage levels of the select signals SEL1-1, SEL1-2, SEL4-1 and SEL4-2 are controlled as shown in Table 2, the voltage of the voltage monitoring pad V_MON may be prevented from being transmitted to the voltage terminals 211 and 214.

Figure 3:
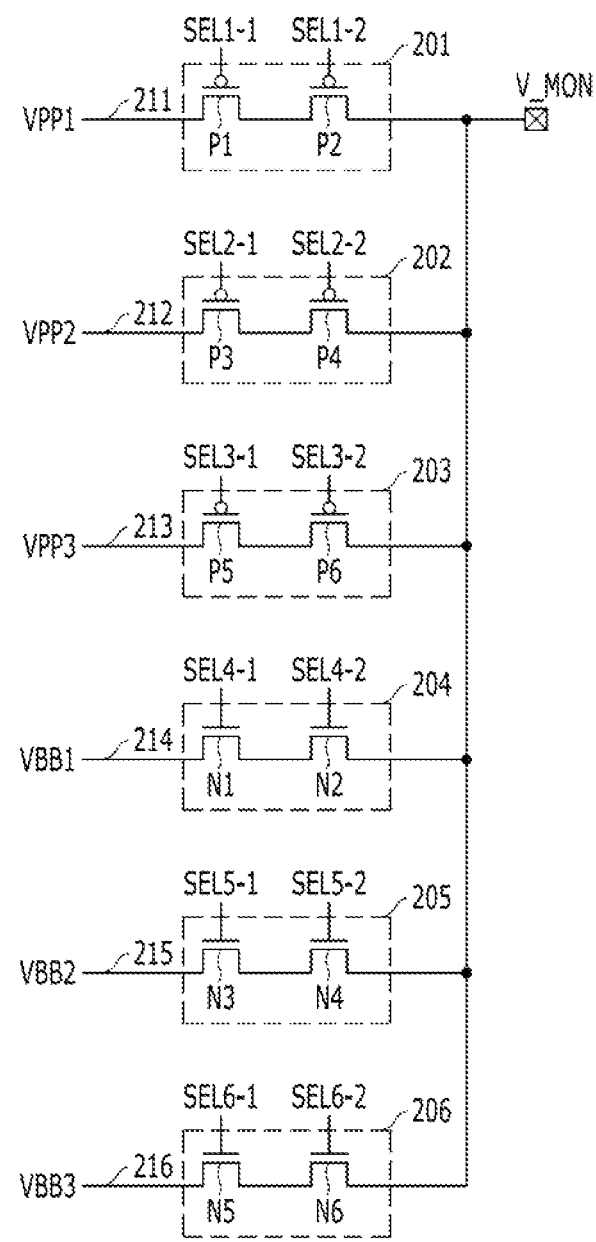
FIG. 3 illustrates a configuration diagram of a semiconductor device in accordance with yet another embodiment of the present invention.

FIG. 3 is a configuration diagram of a semiconductor device in accordance with yet another embodiment of the present invention.

The semiconductor device in accordance with the embodiment of FIG. 3 additionally includes internal high voltage terminals 212 and 213 and internal negative voltage terminals 215 and 216 in comparison to the embodiment of FIG. 2. Thus, switches 202, 203, 205 and 206 are added. Except that the number of internal voltages VPP1, VPP2, VPP3, VBB1, VBB2 and VBB3 monitored through one monitoring pad V_MON is increased, the embodiment of FIG. 3 basically has substantially the same configuration as the embodiment of FIG. 2. Thus, the detailed descriptions thereof are omitted herein.

The activation/deactivation voltage levels of select signals SEL2-1, SEL2-2, SEL3-1 and SEL3-2 may be set to be equal to the activation/deactivation voltage levels of the select signals SEL1-1 and SEL1-2 shown in Table 2, and the activation/deactivation voltage levels of select signals SEL5-1 SEL5-2, SEL6-1 and SEL6-2 may be set to be equal to the activation/deactivation voltage levels of the select signals SEL4-1 and SEL4-2 shown in Table 2.

In accordance with the embodiments of the present invention, the levels of the internal voltages generated in the semiconductor device may be monitored outside the semiconductor device.

In particular, both of a high voltage and a negative voltage may be monitored through one monitoring pad.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
an internal high voltage terminal supplied with an internal high voltage;
an internal negative voltage terminal supplied with an internal negative voltage;
a monitoring pad suitable for monitoring the internal high and negative voltages;
a first switch suitable for controlling electrical connection between the high voltage terminal and the monitoring pad and comprising two or more transistors coupled in series; and
a second switch suitable for controlling electrical connection between the negative voltage terminal and the monitoring pad and comprising two or more transistors coupled in series.

2. The semiconductor device of claim 1, wherein the internal high voltage is higher than a power supply voltage applied from outside the semiconductor device, and
the internal negative voltage is lower than a ground voltage applied from outside the semiconductor device.

3. The semiconductor device of claim 1, wherein the first switch comprises two PMOS transistors coupled in series.

4. The semiconductor device of claim 3, wherein one of the two PMOS transistors coupled to the internal high voltage terminal is controlled by a high voltage and a ground voltage, and
the other PMOS transistor coupled to the monitoring pad is controlled by a power supply voltage and the ground voltage.

5. The semiconductor device of claim 1, wherein the second switch comprises two NMOS transistors coupled in series.

6. The semiconductor device of claim 5, wherein one of the two NMOS transistors coupled to the internal negative voltage terminal is controlled by a negative voltage and a power supply voltage, and
the other NMOS transistor coupled to the monitoring pad is controlled by a ground voltage and the power supply voltage.

7. The semiconductor device of claim 1, wherein the internal high voltage and the internal negative voltage are generated by a pump circuit in the semiconductor device.

8. A semiconductor device comprising:
an internal high voltage terminal supplied with a high voltage higher than a power supply voltage;
an internal negative voltage terminal supplied with a negative voltage lower than a ground voltage;
a monitoring pad suitable for monitoring the high voltage and the negative voltage;
a first PMOS transistor suitable for controlling electrical connection between the internal high voltage terminal and a first node, turned on by the ground voltage, and turned off by the high voltage;
a second PMOS transistor suitable for controlling electrical connection between the first node and the monitoring pad, turned on by the ground voltage, and turned off by the power supply voltage;
a first NMOS transistor suitable for controlling electrical connection between the internal negative voltage terminal and a second node, turned on by the power supply voltage, and turned off by the negative voltage; and
a second NMOS transistor suitable for controlling electrical connection between the second node and the monitoring pad, turned on by the power supply voltage, and turned off by the ground voltage.

9. The semiconductor device of claim 8, wherein the high voltage and the negative voltage are generated by a pump circuit inside the semiconductor device.

10. A semiconductor device comprising:
a first voltage terminal supplied with a first internal voltage;
a second voltage terminal supplied with a second internal voltage;
a monitoring pad suitable for monitoring the first and second internal voltages;
first and second switches coupled in series between the first voltage terminal and the monitoring pad and turned on/off in response to first and second select signals, respectively; and
third and fourth switches coupled in series between the second voltage terminal and the monitoring pad and turned on/off in response to third and fourth select signals, respectively.

11. The semiconductor device of claim 10, wherein the first and second switches are turned on at the same time in response to the activation of the first and second select signals and turned off at the same time in response to the deactivation of the first and second select signals,
wherein deactivation levels of the first and second select signals are different while activation levels of the first and second select signals are the same.

12. The semiconductor device of claim 11, wherein when the first internal voltage includes a high voltage higher than a power supply voltage,
- the first and second switches include a PMOS transistor, and
- the activation levels of the first and second select signals are a level of a ground voltage while the deactivation levels of the first and second select signals are levels of the high voltage and the power supply voltage, respectively.

13. The semiconductor device of claim 11, wherein when the first internal voltage includes a negative voltage lower than a ground voltage,
- the first and second switches include a NMOS transistor, and
- the activation levels of the first and second select signals are a level of a power supply voltage while the deactivation levels of the first and second select signals are levels of the negative voltage and the ground voltage, respectively.

14. The semiconductor device of claim 10, wherein the first and second switches are turned on to transmit the first internal voltage while the third and fourth switches are turned off, and
- the third and fourth switches are turned on to transmit the second internal voltage while the first and second switches are turned off.

* * * * *